United States Patent [19]
Albouy et al.

[11] Patent Number: 5,218,320
[45] Date of Patent: Jun. 8, 1993

[54] WIDEBAND AMPLIFIER CIRCUIT HAVING AUTOMATIC GAIN AND OFFSET VOLTAGE CONTROL

[75] Inventors: Pierre Albouy, Lannion; Guy Cochennec, Pleumeur Bodou, both of France

[73] Assignee: Alcatel N.V., Amsterdam, Netherlands

[21] Appl. No.: 893,805

[22] Filed: Jun. 4, 1992

[30] Foreign Application Priority Data

Jun. 7, 1991 [FR] France .................. 9106939

[51] Int. Cl.$^5$ .................. H03F 3/45; H03F 1/34
[52] U.S. Cl. .................. 330/259; 330/85; 330/97; 330/260
[58] Field of Search .................. 330/97, 85, 259, 260

[56] References Cited

U.S. PATENT DOCUMENTS

| | | | |
|---|---|---|---|
| 3,757,239 | 9/1973 | Langan | 330/260 X |
| 4,088,962 | 5/1978 | Trilling | 330/260 X |
| 4,973,917 | 11/1990 | Johnson | 330/260 X |

FOREIGN PATENT DOCUMENTS 2642918  8/1990  France .

OTHER PUBLICATIONS

Patent Abstracts of Japan, vol. 9, No. 43 (E-298), Feb. 22, 1985; & JP-A-59 183 516 (Nippon Denki K.K.) Oct. 18, 1984.

Electronics and Communications in Japan, vol. 67-C, No. 4, 1984, pp. 85-92, New York, US; T. Kamoto et al.: "Bipolar monolithic very-wideband amplifier".

Primary Examiner—James B. Mullins
Attorney, Agent, or Firm—Sughrue, Mion, Zinn, Macpeak & Seas

[57] ABSTRACT

A wideband amplifier circuit having automatic offset voltage and gain control, the circuit comprising a main amplifier chain, a negative feedback loop for controlling gain, and a negative feedback loop for controlling and cancelling any possible offset voltage at its output, said main amplifier chain including a gain control amplifier block having a gain control input connected to the gain control negative feedback loop; wherein the gain control amplifier block is preceded in the main chain by a symmetrizer-adder block of fixed gain having a first input constituting the input of the amplifier circuit and a second input connected to the negative feedback loop for controlling and cancelling any possible offset voltage at the output.

7 Claims, 3 Drawing Sheets

WIDEBAND AMPLIFIER CIRCUIT HAVING AUTOMATIC GAIN AND OFFSET VOLTAGE CONTROL

The invention relates to a wideband amplifier circuit having automatic gain and offset voltage control, this circuit being, in particular, of a type capable of amplifying a signal of several hundred Mbit/s, e.g. 600 Mbit/s.

The signal is delivered, for example, by a preamplifier associated with an input photodiode.

BACKGROUND OF THE INVENTION

The article "Bipolar monolithic very-wideband amplifier" by T. Kamato, et al., published in the journal Electronics and Communications in Japan, Vol. 67-C, No. 4, 1984, pp. 85 to 92, describes a wideband equalizing amplifier comprising an input amplifier (buffer), an automatic gain control amplifier, an amplifier, and offset control circuit acting on the input of the input amplifier, and an automatic gain control circuit acting on the automatic gain control amplifier. That equalizing amplifier suffers from the drawback of having its gain control dependent on its offset control.

The article entitled "Wideband and high-gain negative-feedback AGC amplifier for high-speed lightwave digital transmission systems" by K. Yamashita et al., published in the journal Electronics Letters of May 9, 1985, Vol. 21, No. 10, pp. 419 and 420, describes an automatic gain control amplifier having the drawback of presenting a gain peak at high frequencies (at about 0.5 GHz) when operating at minimum gain, thus running the risk of oscillation; in addition, correcting this gain peak is difficult because it varies with gain.

An object of the invention is to make automatic gain control and offset control independent from each other.

Another object of the invention is to eliminate the risk of oscillation when the amplifier circuit is operating at high frequency and at minimum gain.

Proposals have also been made by the present Applicant in Document FR-2-642 918 for a wideband amplifier circuit essentially comprising two gain control amplifiers associated with a post-amplifier having a non-inverting output and an inverting output which are respectively connected to two peak detectors. A third amplifier whose output is connected to a gain control input of each of the first two gain control amplifiers has one input at a fixed potential and another input connected via two respective resistances to the above-mentioned two peak detectors.

In the present invention, the Applicant provides a novel type of wideband amplifier circuit which possesses a feedback loop for gain control and another loop for controlling and cancelling any offset voltage that may exist at its output.

SUMMARY OF THE INVENTION

The present invention thus provides a wideband amplifier circuit having automatic offset voltage and gain control, the circuit comprising a main amplifier chain, a negative feedback loop for controlling gain, and a negative feedback loop for controlling and cancelling any possible offset voltage at its output, the main amplifier chain including a gain control amplifier block having a gain control input connected to the gain control negative feedback loop; wherein the gain control amplifier block is preceded in the main chain by a symmetrizer-adder block of fixed gain having a first input constituting the input of the amplifier circuit and a second input connected to the negative feedback loop for controlling and cancelling any possible offset voltage at the output.

Most advantageously, the negative feedback loops are implemented in differential mode. The symmetrizer-adder block comprises two portions: a first portion having an input constituting the first input of the symmetrizer-adder block, a transconductance stage for matching the input impedance of the amplifier circuit and for amplifying a signal applied to the input with fixed gain, and a differential output for putting said signal into differential mode; and a second portion comprising an adder having a differential input connected to the output of the first portion, a differential input constituting the second input of the symmetrizer-adder block, and a differential output providing a signal to be applied to the gain control amplifier block.

According to another feature, the main amplifier chain further includes an output block receiving a differential signal delivered by the gain control amplifier block and having a differential output constituting the output of the amplifier circuit and delivering a differential signal whose common mode voltage is servo-controlled to be equal to a fixed voltage. Preferably, the output block delivers differential signals of twice 500 mV centered on a voltage of $-1.32$ V. Also preferably, the negative feedback loops include operational amplifiers having differential inputs and outputs. An operational amplifier in a negative feedback loop may be an operational amplifier having a differential output with output control common mode voltage.

BRIEF DESCRIPTION OF THE DRAWINGS

An embodiment of the invention is described by way of example with reference to the accompanying drawings, in which.

DETAILED DESCRIPTION

Figure 1:
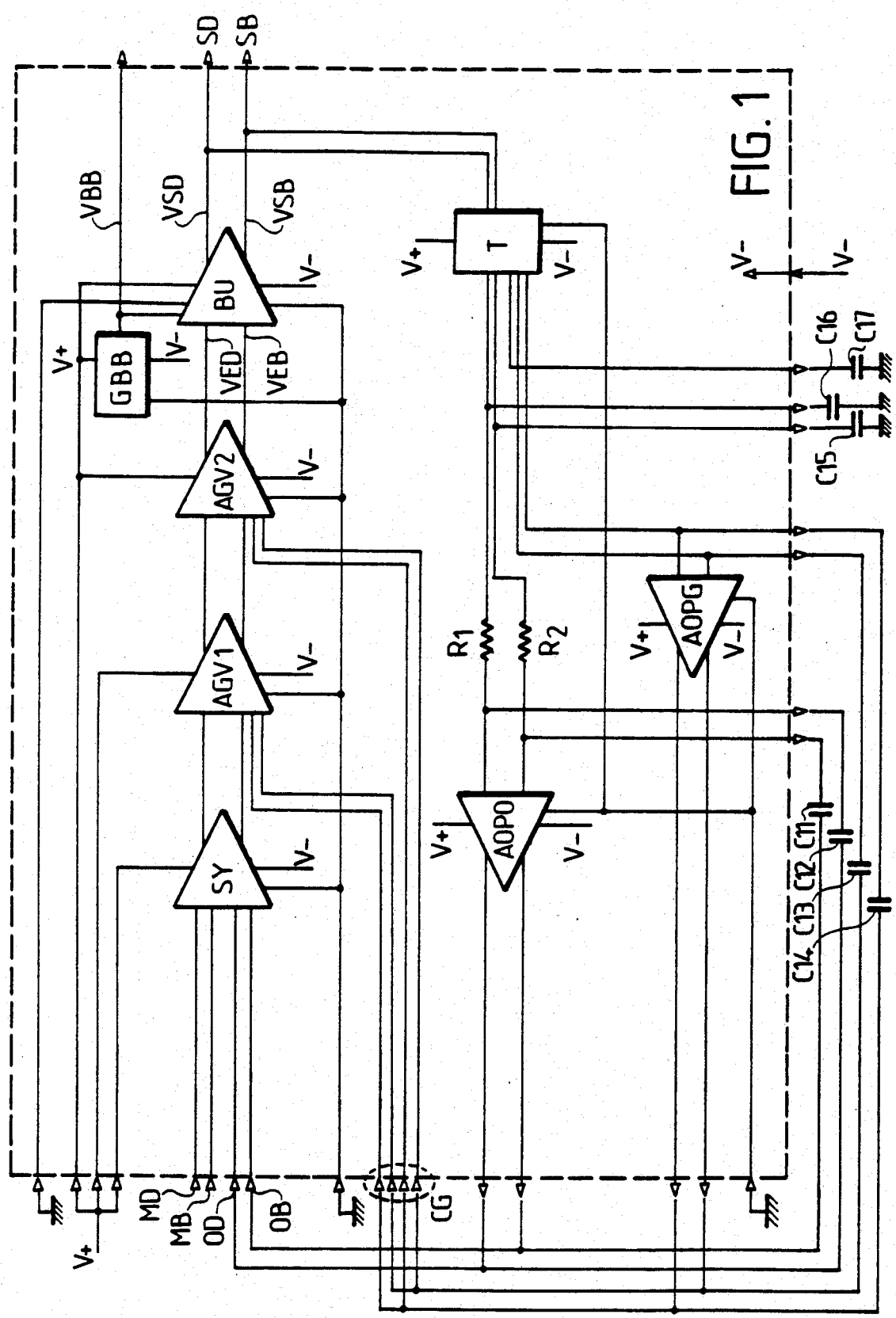
FIG. 1 is a diagram of an amplifier circuit of the invention.

FIG. 1 shows an amplifier circuit of the invention including a main amplifier chain comprising a fixed gain symmetrizer-adder SY followed by two variable-gain amplifiers AGV1 and AGV2, and an output block or buffer BU, all connected in cascade.

Each of the gain and feedback offset loops is constituted by a corresponding operational amplifier referenced AOPG or AOPO together with a common stage T referred to as a differential transfer component. A generator GBB delivers a fixed voltage VBB used by the output block BU to control the common mode voltage at the output of the amplifier circuit.

The amplifier circuit receives a signal to be amplified via an asymmetrical input MD, MB. It delivers an amplified signal VSD, VSB on a differential output SD, SB. The components within the dashed-line box in the figure are constituted on a single integrated circuit. The other components lie outside the integrated circuit. All of the components are powered by a voltage V+ and a voltage V− which are respectively positive and negative relative to a reference potential.

The differential voltage VSD, VSB at the output of the output amplifier BU is applied to the differential transfer component T. The component T is associated with three capacitors C15, C16, C17 for determining the following in a conventional manner: firstly a peak value of the differential signal VSD, VSB; and secondly any possible offset voltage. A first differential output of the component T delivers an offset correction signal and it is connected both to a differential input of the amplifier AOPO via two resistances R1 and R2, and to the reference potential via the capacitors C15 and C16. A second differential output of the component T provides a gain control signal and is connected to a differential input of the amplifier AOPG via direct links. A differential output from the amplifier AOPO constitutes a control loop output for cancelling any possible offset. This output delivers a differential voltage to a differential input OD, OB of the symmetrizer-adder SY for the purpose of correcting the offset voltage, and it is looped back to the differential input of the amplifier AOPO via two respective capacitors C11 and C12.

A differential output of the amplifier AOPG constitutes an output of the gain control loop. This output is connected to a differential input CG common to both amplifiers AVG1 and AVG2 and serving to provide voltage control of their gains. This output is also looped back to the differential input of the amplifier AOPG via two respective capacitors C13 and C14.

Differential mode is used for both of the two negative feedback loops, thereby providing improved immunity to external disturbances and thus providing lower output noise, overall.

Figure 2:
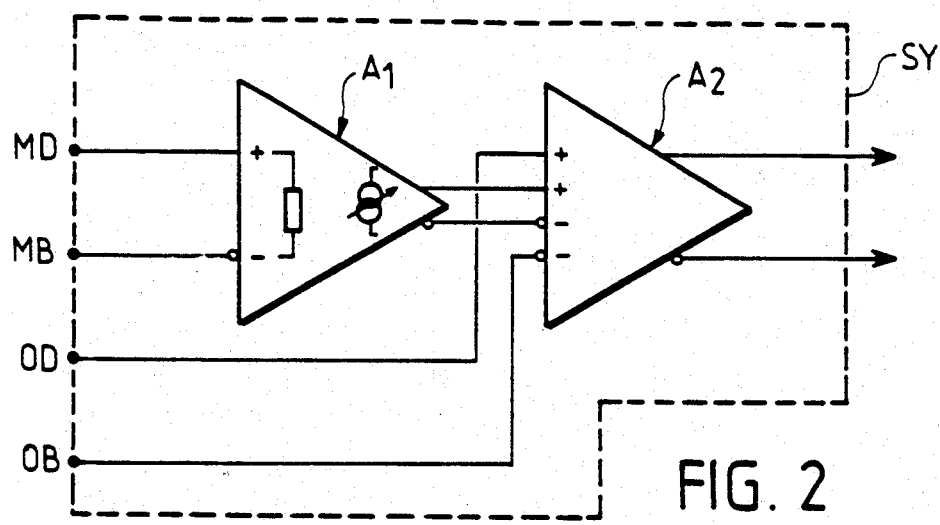
FIG. 2 is a more detailed representation of a portion of the amplifier circuit of FIG. 1.

The block SY is shown in greater detail in FIG. 2. This block comprises a first amplifier A1 which makes the signal to be amplified symmetrical by putting it into differential mode, and which matches the input impedance and signal amplitude via a transconduction stage, followed by a second amplifier A2 which adds the differential output signal from the amplifier A1 with the differential voltage signal for correcting the offset voltage, followed by a fixed gain amplifier for feeding the following block. The amplifier A2 has a differential output connected to a differential input of the amplifier AGV1.

Such a structure presents numerous advantages. In particular, its input impedance is fixed and is not varied by changes of gain, as happens in particular with amplifier circuits known in the past in which the amplifier receiving the input voltage also receives the gain negative feedback loop.

Similarly, the offset voltage is added in differentially and at a point of greatest impedance since it no longer takes place directly on the input. Symmetrization (i.e. converting from asymmetrical input mode to differential output mode) takes place therein over two stages and reduces common mode injection at the input of the variable gain block AGV1, AGV2. Here again, the fixed gain prior to passing through the variable gain amplifiers AGV1 and AGV2 improves the signal to noise ratio S/N.

Figure 3:
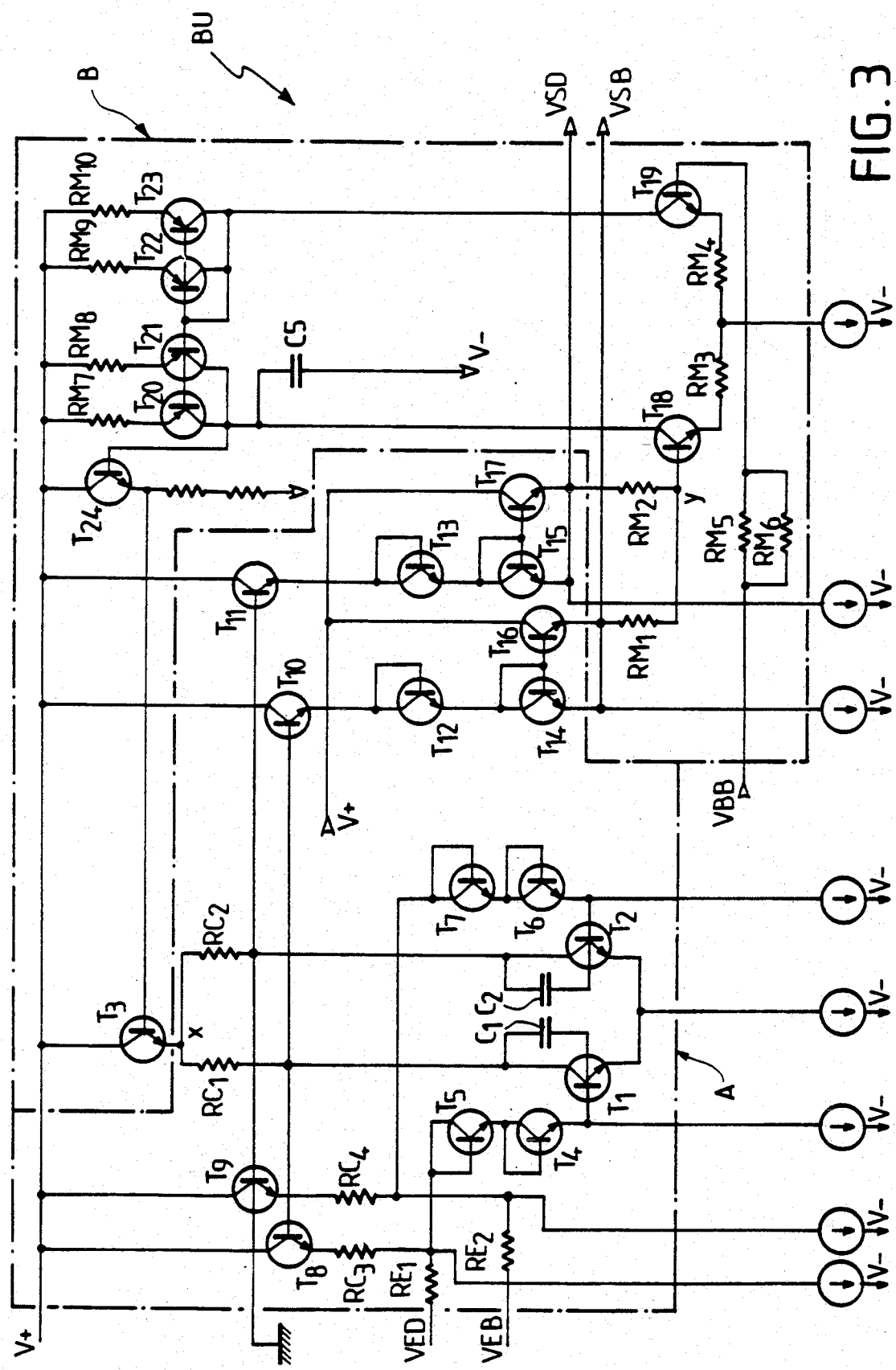
FIG. 3 is a diagram of an output subcircuit of the amplifier circuit of FIG. 1.

The output block BU is shown in greater detail in FIG. 3. This block is required to deliver differential signals of twice 500 mV centered on the voltage VBB (−1.32 V). The amplitude is controlled by the negative feedback loop acting on the gain, but a special structure is required to control the common mode output voltage. Conventional structures enabling control of this type to be performed are already known. The variations in base-collector voltages of transistors are compensated therein by variations in base-emitter voltages of other transistors, but always to the detriment of passband performance. The invention proposes a structure that enables this drawback to be mitigated.

This structure is shown more particularly in FIG. 3 and it comprises, in particular, a portion A servo-controlled by a portion B. The portion A amplifies the differential signal VED, VEB applied to the input of the output block BU and it delivers the differential signal VSD, VSB at the output of the block BU. The differential signal VSD, VSB has a common mode voltage which is controllable by a voltage applied to an input X of the portion A. The input X is connected to an output of the portion B. This achieves servo-control which provides the point X with a voltage such that the common mode voltage at the output of the block BU is always equal to the fixed voltage VBB.

More precisely, the portion A mainly comprises two transistors T1 and T2 connected as a differential pair with the bases of these transistors T1 and T2 being connected to their collectors via respective compensation capacitors C1 and C2. The common terminals, firstly between the capacitor C1 and the collector of transistor T1, and secondly between the capacitor C2 and the collector of the transistor T2 are connected via respective resistances RC1 and RC2 to the emitter of a transistor T3 belonging to the portion B. The point X is the common terminal between the emitter of transistor T3 and the resistances RC1 and RC2. The base of transistor T1 is also connected to two transistors T4 and T5 connected as series diodes and receiving one of the input voltages VED to the output block via an input resistance RE1. Symmetrically, the transistor T2 is associated with two transistors T6 and T7 connected as series diodes and receiving the second differential input voltage VEB of the output block BU via a resistance RE2. The common point between the resistance RE1 and the diode-connected transistors T4 and T5, and the common point between the resistance RE2 and the transistors T6 and T7 are connected to the respective emitters of two transistors T8 and T9 via two negative feedback resistances RC3 and RC4. The transistors T8 and T9 are common collector connected. Their bases are respectively connected to the bases of two transistors T10 and T11 likewise in common collector configurations. The bases of T8, T10 and of T9, T11 are respectively connected to the collectors of T1 and T2. The emitters of the two transistors T10 and T11 are respectively connected to the collectors of diode connected transistors T12 and T13 themselves in series with respective transistors T14 and T15 also connected as diodes and having their bases and collectors respectively connected to the bases of respective transistors T16 and T17. The emitters of the transistors T16 and T17 deliver the differential output voltages VSD and VSB of the output block BU. Their collectors are connected together to a power supply voltage V+.

The portion B is connected to said portion A in particular via two resistances RM1 and RM2 connected to the emitters of the transistors T16 and T17 and having a common terminal at a point Y which is connected to the base of a transistor T18. The point Y delivers the mean of VSD and VSB, i.e. the common mode voltage of the differential signal VSD, VSB. This voltage is compared with the reference voltage VBB by means of the transistors T18 and T19 which are connected as a differential amplifier. The emitter of transistor T18 is connected via a resistor RM3 both to a biasing wire and to another resistance RM4 which is connected to the emitter of the transistor T19. The transistor T19 receives the voltage VBB on its base via two resistances RM5 and RM6 connected in parallel. The collector of transistor T18 is connected firstly to a decoupling capacitor C5 and secondly to the collectors of two PNP transistors T20 and T21 whose emitters are connected via resistances RM7 and RM8 to the common voltage V+. Similarly, the collector of transistor T19 is connected to the collectors of two transistors T22 and T23 connected as diodes and whose emitters are also connected via resistances RM9 and RM10 to the common voltage V+. The bases of transistors T20 to 23 are all connected together. The terminal common to the collectors of transistors T20 and T21 is connected to the base of a common collector transistor T24 whose emitter is connected to the base of transistor T3 whose emitter is connected to the circuit A.

The common mode voltage of VSD, VSB of circuit A is a function of the potential at point X. This potential may vary under the action of said circuit B which is a servo-control circuit controlling the voltage at Y and maintaining it equal to the voltage VBB. This fixed voltage VBB is given by the conventionally designed band-gap generator GBB.

Figure 4:
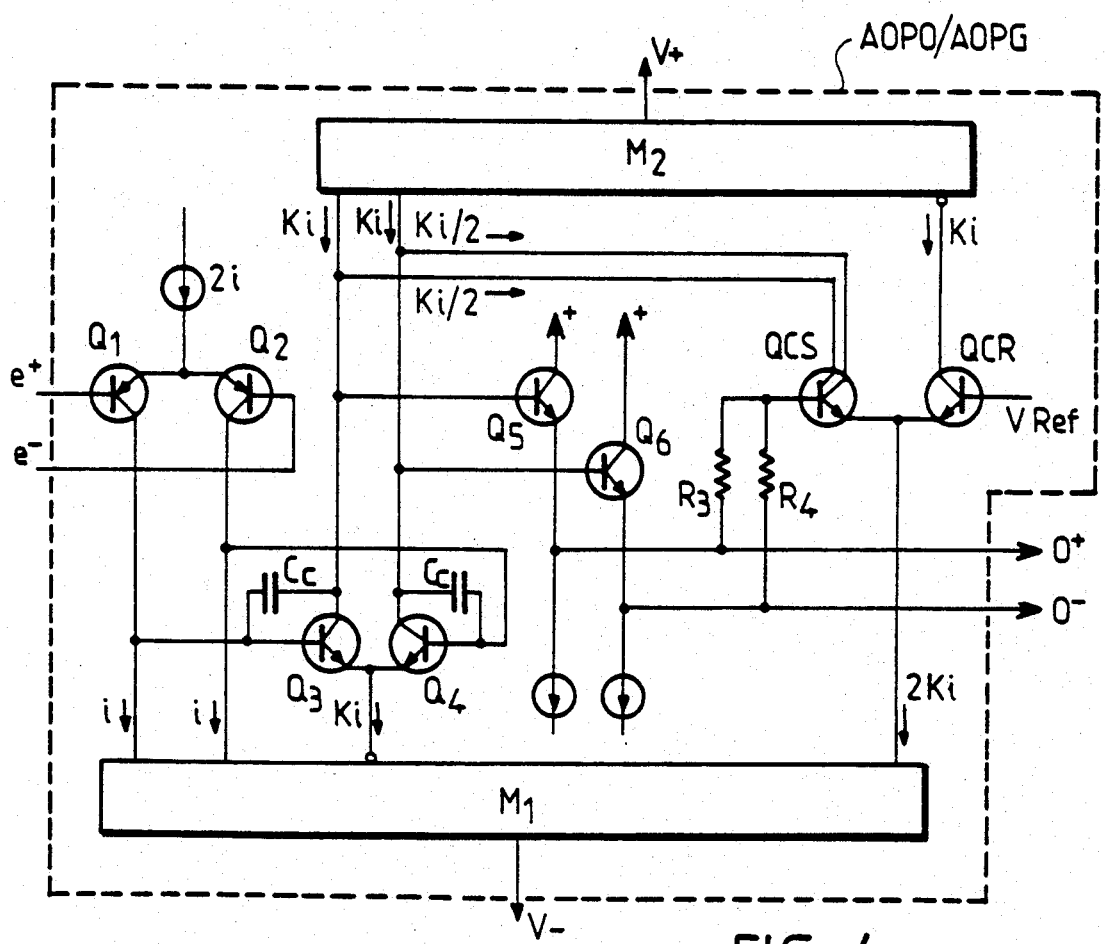
FIG. 4 shows one particular embodiment of a unit of the amplifier circuit of FIG. 1.

FIG. 4 shows an operational amplifier having a differential input and a differential output and suitable for use in implementing the amplifier AOPO or the amplifier AOPG. It is an operational amplifier having a differential output and having a common mode voltage that is output controlled. It is essentially constituted by a current mirror M1 receiving two input currents i taken from the collectors of two PNP transistors Q1 and Q2 connected as a differential pair and biased by a current source delivering a current 2i. Between the collectors of these two transistors Q1 and Q2 there is a differential pair of NPN transistors Q3 and Q4 whose emitters are connected by a common wire to the current mirror M1 which receives a current Ki therefrom. The collector and the base of each of these two transistors Q3 and Q4 are connected together via respective compensation capacitors $C_c$. The collectors of these two transistors Q3 and Q4 are also connected to outputs of a mirror M2. Each of these two outputs delivers a current Ki to the corresponding transistor Q3, Q4 with which it is associated. This current Ki is split into two currents Ki/2 one of which goes to a corresponding collector of a two-collector transistor QCS which is associated with a single-collector transistor QCR to form a differential pair powered by a current source delivering a current of 2Ki, with the collector of transistor QCR being connected to the mirror M2, and with its base receiving a reference voltage Vref. Between each of the collectors of the transistors Q3 and Q4 and the node which delivers a portion of the current Ki delivered at the output of the mirror M2 to the differential amplifier QCS, QCR, there are connected the respective bases of common-collector connected transistors Q5 and Q6 whose emitters receive respective output voltages O+ and O−. Resistances R3 and R4 respectively connect the base of transistor QCS to O+ and to O−.

Thus the current source delivering a current of 2i controls all of the currents in the amplifier. The common mode equilibrium of the common mode currents of the first stage is provided by the mirror M1 fed by the second differential stage. Output common mode equilibrium is provided by the differential amplifier QCS-QCR. QCS has two outputs (two collectors in parallel) which act directly on the collectors of transistor Q3 and Q4, thereby ensuring that the common mode feedback loop is stable without there being any need for compensation capacitances other than the capacitors $C_c$ (the capacitors $C_c$ are required for differential mode).

Any reference symbols inserted after the technical characteristics specified in the claims are intended solely to facilitate understanding thereof, and do not limit their scope in any way.

I claim:

1. A wideband amplifier circuit having automatic offset voltage and gain control, the wideband amplifier circuit comprising: a main amplifier chain, a negative feedback loop for controlling gain as a function of the peak value of a differential signal supplied by an output of said main amplifier chain, and a negative feedback loop for controlling and cancelling any possible offset voltage at its output, said main amplifier chain including a gain control amplifier block having a gain control input connected to the gain control negative feedback loop; wherein the gain control amplifier block is preceded in the main amplifier chain by a symmetrizer-adder block of fixed gain having a first input constituting the input of the wideband amplifier circuit and a second input connected to the negative feedback loop for controlling and cancelling any possible offset voltage at the output.

2. The wideband amplifier circuit according to claim 1, wherein the negative feedback loop for controlling gain and the negative feedback loop for controlling and cancelling any possible offset voltage are implemented in differential mode.

3. The wideband amplifier according to claim 2, wherein the symmetrizer-adder block comprises two portions: a first portion having an input constituting the first input of the symmetrizer-adder block, a transconductance stage for matching the input impedance of the wideband amplifier circuit and for amplifying a signal applied to said input with fixed gain, and a differential output for putting said signal into differential mode; and a second portion comprising an adder having a differential input connected to the output of the first portion, a differential input constituting the second input of the symmetrizer-adder block, and a differential output providing a signal to be applied to the gain control amplifier block.

4. The wideband amplifier circuit according to claim 2, wherein the main amplifier chain further includes an output block receiving means for receiving a differential signal delivered by the gain control amplifier block and having a differential output constituting the output of the wideband amplifier circuit and for delivering a differential signal whose common mode voltage is servo-controlled to be equal to a fixed voltage.

5. The wideband amplifier circuit according to claim 4, wherein the output block receiving means delivers differential signals of twice 500 mV centered on a voltage of −1.32 V.

6. The wideband amplifier circuit according to claim 2, wherein the negative feedback loop for controlling the gain and the negative feedback loop for controlling and cancelling any possible offset voltage include operational amplifiers having differential inputs and outputs.

7. The wideband amplifier circuit according to claim 6, wherein at least one of the operational amplifiers in a negative feedback loop is an operational amplifier having a differential output with output control common mode voltage.

* * * * *